United States Patent
Liu et al.

(10) Patent No.: US 10,615,276 B2
(45) Date of Patent: Apr. 7, 2020

(54) INTEGRATION OF INPUT/OUTPUT DEVICE IN VERTICAL FIELD-EFFECT TRANSISTOR TECHNOLOGY

(71) Applicant: INTERNATIONAL BUSINESS MACHINES CORPORATION, Armonk, NY (US)

(72) Inventors: Xuefeng Liu, Schenectady, NY (US); Junli Wang, Albany, NY (US); Brent A. Anderson, Jericho, VT (US); Terence B. Hook, Jericho, VT (US); Gauri Karve, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/853,071

(22) Filed: Dec. 22, 2017

(65) Prior Publication Data
US 2019/0198667 A1    Jun. 27, 2019

(51) Int. Cl.
*H01L 21/762*  (2006.01)
*H01L 29/78*  (2006.01)
(Continued)

(52) U.S. Cl.
CPC ........ *H01L 29/7827* (2013.01); *H01L 21/762* (2013.01); *H01L 27/088* (2013.01);
(Continued)

(58) Field of Classification Search
CPC .............. H01L 29/7827; H01L 21/762; H01L 29/41741; H01L 29/6656; H01L 29/66666;
(Continued)

(56) References Cited

U.S. PATENT DOCUMENTS

| 6,180,470 B1 * | 1/2001 | Aronowitz .......... H01L 21/2652 438/301 |
| 8,513,739 B2 | 8/2013 | Anderson et al. |

(Continued)

OTHER PUBLICATIONS

Anonymous, "Vertical FET Multiple Vt Realization by Gate Pitch Patterning", An IP.com Prior Art Database Technical Disclosure, IP.com Electronic Publication Date: Apr. 18, 2016, IP.com No. IPCOM000245925D, pp. 1-6.
(Continued)

*Primary Examiner* — Shahed Ahmed
(74) *Attorney, Agent, or Firm* — Tutunjian & Bitetto, P.C.; Vazken Alexanian

(57) ABSTRACT

A vertical field-effect transistor (FET) device and an input/output (IO) FET device are formed. The vertical FET device is formed in a vertical FET device area of a substrate and the IO FET device is formed in an IO FET device area of the substrate. Forming the vertical FET device and the IO FET device includes forming a plurality of first fin structures in the vertical FET device area and forming at least two second fin structures in the IO FET device area. The at least two second fin structures are separated by a distance associated with a length of a channel connecting the at least two fin structures in the IO FET device area. The length of the channel is determined based on at least one voltage for implementing the IO FET device.

15 Claims, 9 Drawing Sheets

(51) Int. Cl.
   *H01L 29/66*   (2006.01)
   *H01L 29/417*  (2006.01)
   *H01L 29/10*   (2006.01)
   *H01L 27/088*  (2006.01)

(52) U.S. Cl.
   CPC .... *H01L 29/1037* (2013.01); *H01L 29/41741* (2013.01); *H01L 29/41783* (2013.01); *H01L 29/6656* (2013.01); *H01L 29/66628* (2013.01); *H01L 29/66666* (2013.01); *H01L 29/66795* (2013.01); *H01L 29/78* (2013.01); *H01L 29/785* (2013.01); *H01L 21/76224* (2013.01)

(58) Field of Classification Search
   CPC ............. H01L 29/66795; H01L 29/785; H01L 27/11273; H01L 29/66272; H01L 29/66909; H01L 29/732; H01L 29/7788; H01L 27/2454; H01L 21/823885; H01L 27/0821; H01L 21/823487
   See application file for complete search history.

(56) References Cited

U.S. PATENT DOCUMENTS

| | | | |
|---|---|---|---|
| 9,224,837 B2 | 12/2015 | Anderson et al. | |
| 9,391,170 B2 | 7/2016 | Park | |
| 9,431,305 B1* | 8/2016 | Anderson et al. | ........................... H01L 21/823885 |
| 9,570,555 B1* | 2/2017 | Pranatharthiharan | ....................... H01L 29/0847 |
| 9,786,788 B1 | 10/2017 | Anderson et al. | |
| 9,799,749 B1 | 10/2017 | Bi et al. | |
| 10,084,085 B2 | 9/2018 | Chang et al. | |
| 10,170,473 B1* | 1/2019 | Zang | ................... H01L 27/0886 |
| 10,453,943 B2 | 10/2019 | Lin et al. | |
| 2010/0207182 A1 | 8/2010 | Paschal | |
| 2015/0325576 A1 | 11/2015 | Basker et al. | |
| 2017/0062606 A1 | 3/2017 | Harrington, III et al. | |
| 2017/0178970 A1 | 6/2017 | Anderson et al. | |
| 2017/0287911 A1 | 10/2017 | Nowak et al. | |
| 2018/0151561 A1* | 5/2018 | Cantoro | ................ H01L 27/088 |

OTHER PUBLICATIONS

Anonymous, "Method and Structure of Forming Long Channel VFET with Dielectric Isolation", An IP.com Prior Art Database Technical Disclosure, IP.com Electronic Publication Date: Nov. 21, 2017, IP.com No. IPCOM000251663D, pp. 1-7.

* cited by examiner

INTEGRATION OF INPUT/OUTPUT DEVICE IN VERTICAL FIELD-EFFECT TRANSISTOR TECHNOLOGY

BACKGROUND

Technical Field

The present invention generally relates to semiconductor devices, and more particularly to vertical field-effect transistor (FET) devices.

Description of the Related Art

Fin complementary metal-oxide-semiconductor (CMOS) integration has been a building block in modern CMOS technology. Vertical FETs have been devised as a way to reduce contact poly pitch (CPP) to decrease unit cell size and increase efficiency by orienting current flow vertically. Vertical FETs reduce or eliminate parasitic capacitance and conductance from a substrate. Further, since the ohmic contacts and the channels are aligned vertically, current density per unit of surface area in a vertical FET is much higher than in a planar FET.

SUMMARY

In accordance with an embodiment of the present invention, a method is provided for fabricating a semiconductor device that integrates an input/output (IO) device in vertical field-effect transistor (FET) technology. The method includes forming a vertical FET device and an IO FET device. The vertical FET device is formed in a vertical FET device area of a substrate and the IO FET device is formed in an IO FET device area of the substrate. Forming the vertical FET device and the IO FET device includes forming a plurality of first fin structures in the vertical FET device area and forming at least two second fin structures in the IO FET device area. The at least two second fin structures are separated by a distance associated with a length of a channel connecting the at least two fin structures in the IO FET device area. The length of the channel is determined based on at least one voltage for implementing the IO FET device.

In accordance with another embodiment of the present invention, a method for fabricating a semiconductor device that integrates an input/output (TO) device in vertical field-effect transistor (FET) technology is provided. The method includes forming a vertical FET device and an IO FET device. The vertical FET device is formed in a vertical FET device area of a substrate and the IO FET device is formed in an IO FET device area of the substrate. Forming the vertical FET device and the IO FET device includes forming a plurality of first fin structures in the vertical FET device area and forming at least two second fin structures in the IO FET device area. The at least two second fin structures are separated by a distance associated with a length of a channel connecting the at least two fin structures in the IO FET device area, and the length of the channel is determined based on at least one voltage for implementing the IO FET device. The method further includes forming a first spacer on the substrate and selectively removing a portion of the first spacer in the IO FET device area to create an exposed portion of the IO FET device area. Selectively removing the portion of the first spacer includes forming a mask over the vertical FET device area and select portions of the IO FET device area, and etching away the first spacer from portions of the IO FET device area that are protected by the mask. The method further includes depositing gate material on the fin structures and the exposed portion of the IO FET device area, forming an interlayer dielectric (ILD), forming a second spacer on the ILD, forming respective epitaxial layers on the first and second fin structures, forming an ILD cap layer, and forming a plurality of first contacts in the vertical FET device area and a plurality of second contacts in the IO FET device area.

In accordance with yet another embodiment of the present invention, a semiconductor device that integrates an input/output (TO) device in vertical field-effect transistor (FET) technology is provided. The device includes a substrate having a vertical FET device area and an IO FET device area, a vertical FET device formed in the vertical FET device area and an IO FET device formed in the IO FET device area. The IO FET device includes at least two fin structures formed in the IO FET device area. The at least two second fin structures are separated by a distance associated with a length of a channel connecting the at least two fin structures in the IO FET device area, and the length of the channel is determined based on at least one voltage for implementing the IO FET device.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
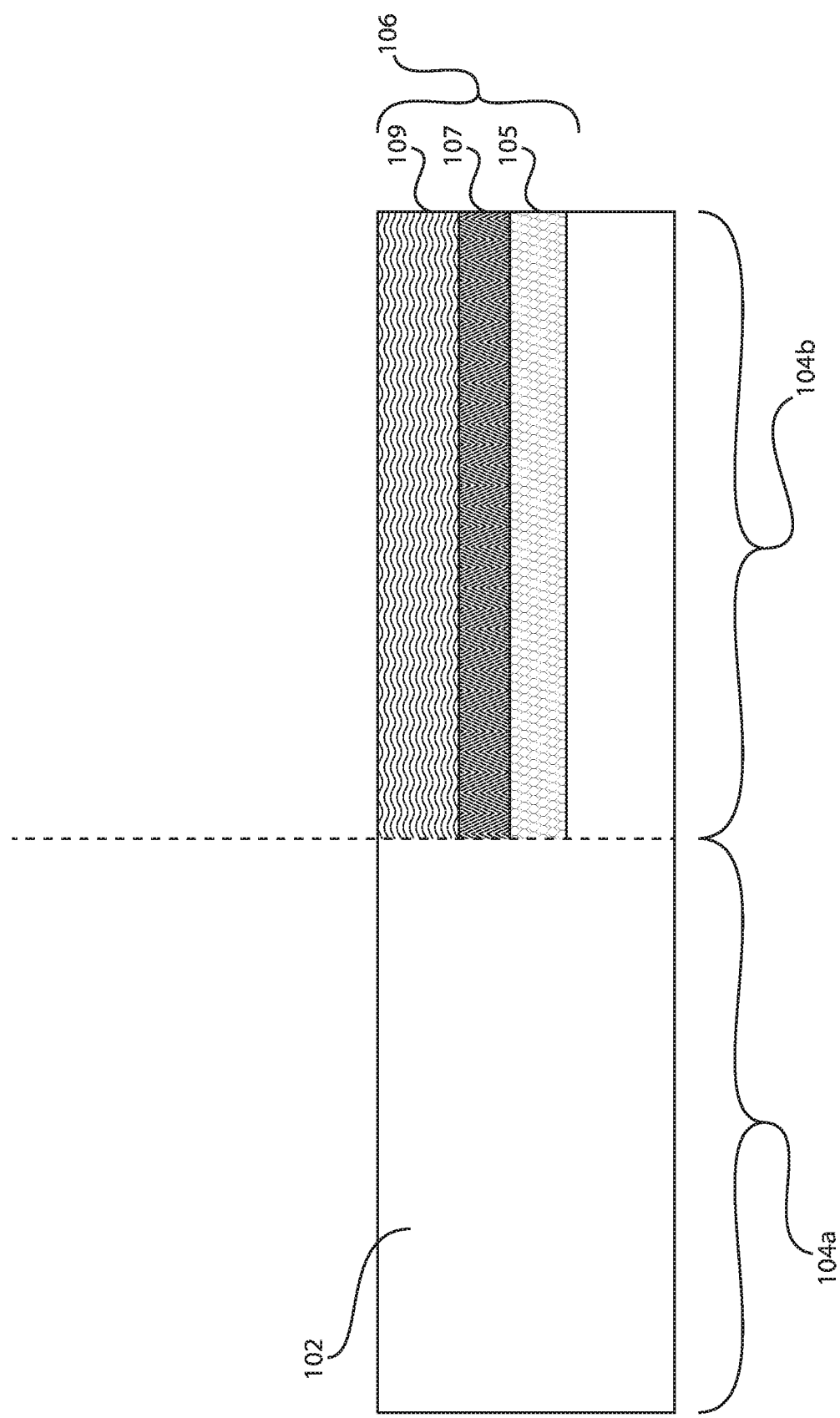
FIG. 1 is a cross-sectional view showing a substrate having a vertical field-effect transistor (FET) device area and an input/output (TO) device area of a semiconductor device that integrates an IO FET device in vertical FET technology, in accordance with an embodiment of the present invention.

An input/output device provides a first stage for signal IO in integrated circuit (ICs). An IO device can be one important part of a system on chip (SOC). IO devices can be employed for high voltage applications (e.g., 1.8V, 2.5V or 3.3V breakdown voltages). To support such high voltages, the gate length ($L_g$) needs to be larger than that of a typical logic device. However, it is difficult to provide different $L_g$'s for vertical field-effect transistors (FETs).

Embodiments of the present invention provide an input/output (IO) device integration scheme compatible to vertical field-effect transistor FET technology. For example, embodiments of the present invention provide for the formation of an IO FET device on the same substrate as a vertical FET device in a way that allows for the voltage (e.g., breakdown voltage) and/or drive current needs of the IO FET device for an application to be met. The IO FET device described herein achieves a given $L_g$ by leveraging the sidewalls of at least two fins and/or the planar distance between the at least two fins. By doing so, a longer IO FET device is provided without having to modify the fin height to increase $L_g$ in the vertical direction.

An IO device formed in accordance with aspects of the present invention can provide one or more of the following: (1) high voltage tolerance; (2) high current drive capability; (3) reduced delay; (4) voltage level shifting; and (5) electrostatic discharge protection.

In a preferred embodiment, the IO FET device includes two fins, representing source and drain regions, that are connected via a U-shaped channel having a planar channel region. Different voltages for the IO FET device (e.g., breakdown voltages) can thus be achieved by varying the length of the planar channel region (e.g., distance between the fins). Therefore, embodiments of the present invention allow for the integration of an IO device in vertical FET technology by addressing voltage and/or drive current needs for the IO device.

Exemplary applications/uses to which the present invention can be applied include, but are not limited to, semiconductor device and integrated circuit design.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, FIGS. 1-8 depict respective steps of a process flow for fabricating a semiconductor device 100 that integrates an IO device in vertical FET technology.

With reference to FIG. 1, a substrate 102 of the device 100 is formed. As shown, the substrate 102 has two device regions or areas, including vertical FET device area 104a and IO FET device area 104b. The substrate 102 can include any suitable substrate structure, e.g., a bulk semiconductor, a semiconductor-on-insulator (SOI) substrate, etc. The substrate 102 can be composed of any material suitable for use in accordance with the embodiments described herein. In one example, the substrate 102 can include a silicon-containing material. Illustrative examples of Si-containing materials suitable for the substrate 102 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

A channel doping process is performed to form doped region 106 within the IO FET device area 104b. As shown, the doped region 106 can include three layers, including layers 105, 107 and 109. A p-n junction is formed by the doped region 106 to provide channel isolation from the substrate 102. Layer 107 can include a lightly doped semiconductor material having a corresponding conductivity type. That is, layer 107 can be an n-layer or a p-layer. Layers 105 and 109 can have any doping concentration in accordance with the embodiments described herein.

The doped region 106 can be formed by utilizing a well doping process. The well doping process can utilize ion implantation. For example, at least a two-step ion implantation process can be performed to adjust doping level in the equal fin height region and fin bottom region for breakdown tuning. A counter-doping for a p-n junction can be needed for channel isolation. No extra mask may be needed for the well doping process, thereby reducing cost.

Figure 2:
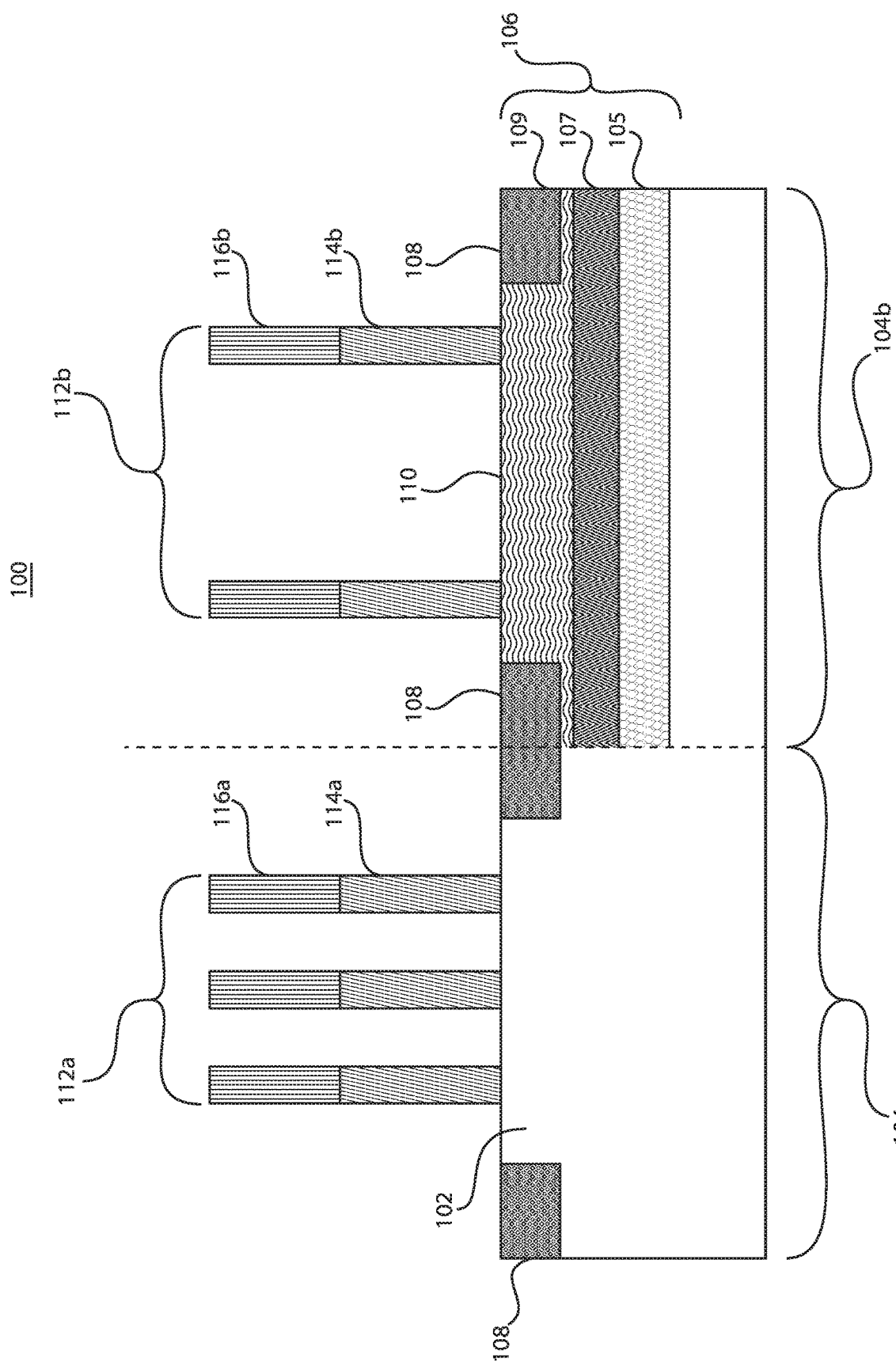
FIG. 2 is a cross-sectional view showing the formation of shallow trench isolation (STI) regions and fin structures of the semiconductor device, in accordance with an embodiment of the present invention.

With reference to FIG. 2, a plurality of shallow trench isolation (STI) regions 108 are formed with the substrate 102. The STI regions 108 can be formed by etching trenches in the substrate 102, and filling the trenches with a dielectric material, such as silicon dioxide ($SiO_2$). The etching can utilize an etching process such as reactive-ion etching (RIE) or plasma etching. After the etching, the trenches can then be optionally lined with a liner material, e.g., an oxide, prior to filling the trenches with the STI material using a suitable deposition process (e.g., CVD). A planarization process such as chemical-mechanical polishing (CMP) can optionally be employed after the filling to provide a planar structure.

As further shown in FIG. 2, fin structures are formed on the substrate 102, including a plurality of fin structures 112a formed in the vertical FET device area 104a, and a plurality of fin structures 112b formed in the IO FET device area 104b.

Conventional vertical field-effect transistors (FETs) typically have a supply voltage (Vdd) of around 0.8V. However, such a Vdd does not meet one or more voltage and/or drive current needs for IO devices (e.g., 1.8V, 2.5V or 3.3V breakdown voltages for an IO FET device). Therefore, conventional semiconductor fabrication methods do not permit the integration of IO devices in vertical FET technology.

To address this issue, the fin structures 112b include two fin structures connected between a channel 110 including a planar portion. In one embodiment, the channel 110 is a U-shaped channel. At least one voltage for implementing the IO FET device being formed in the IO FET device area 104b, such as the breakdown voltage, is a function of the distance between the two fin structures connected between the channel. Thus, the length of the planar portion of the channel 110 can be selected to meet the distance between the two fin structures of fin structures 112b for attaining at least one desired voltage (e.g., breakdown voltage) for implementing the IO FET device being formed in the IO FET device area 104b.

Each of the fin structures 112a includes a fin 114a and a cap 116a formed on the fin 114a, while each of the fin structures 112b includes a fin 114b and a cap 116b formed on the fin 114b. Although three fin structures 112a are depicted and two fin structure 112b are depicted in this illustrative embodiment, the present disclosure is not limited to only this example.

The fins 114a and 114b can be composed of any material suitable for use as semiconductor fins in accordance with the embodiments described herein, and can be formed on the substrate 102 using one or more processes, such as photolithography and/or etch processes. The dimensions of the fins 114a and 114b can be chosen based on current capabilities.

The caps 116a and 116b can be composed of soft and/or hard mask materials suitable for use in accordance with the embodiments described herein, and can be formed using one or more processes, such as deposition, photolithography and/or etching. In one embodiment, one or more of the caps 116a and 116b are composed of a nitride-containing material, such as silicon nitride. It is noted that it is not intended that the cap material be limited to only silicon nitride, as the composition of the caps 116a and 116b can include any dielectric material that can be deposited by chemical vapor deposition (CVD) and/or related methods.

The STI regions 110 and fin structures 112a and 112b can be formed in any order, in accordance with the embodiments described herein.

Figure 3:
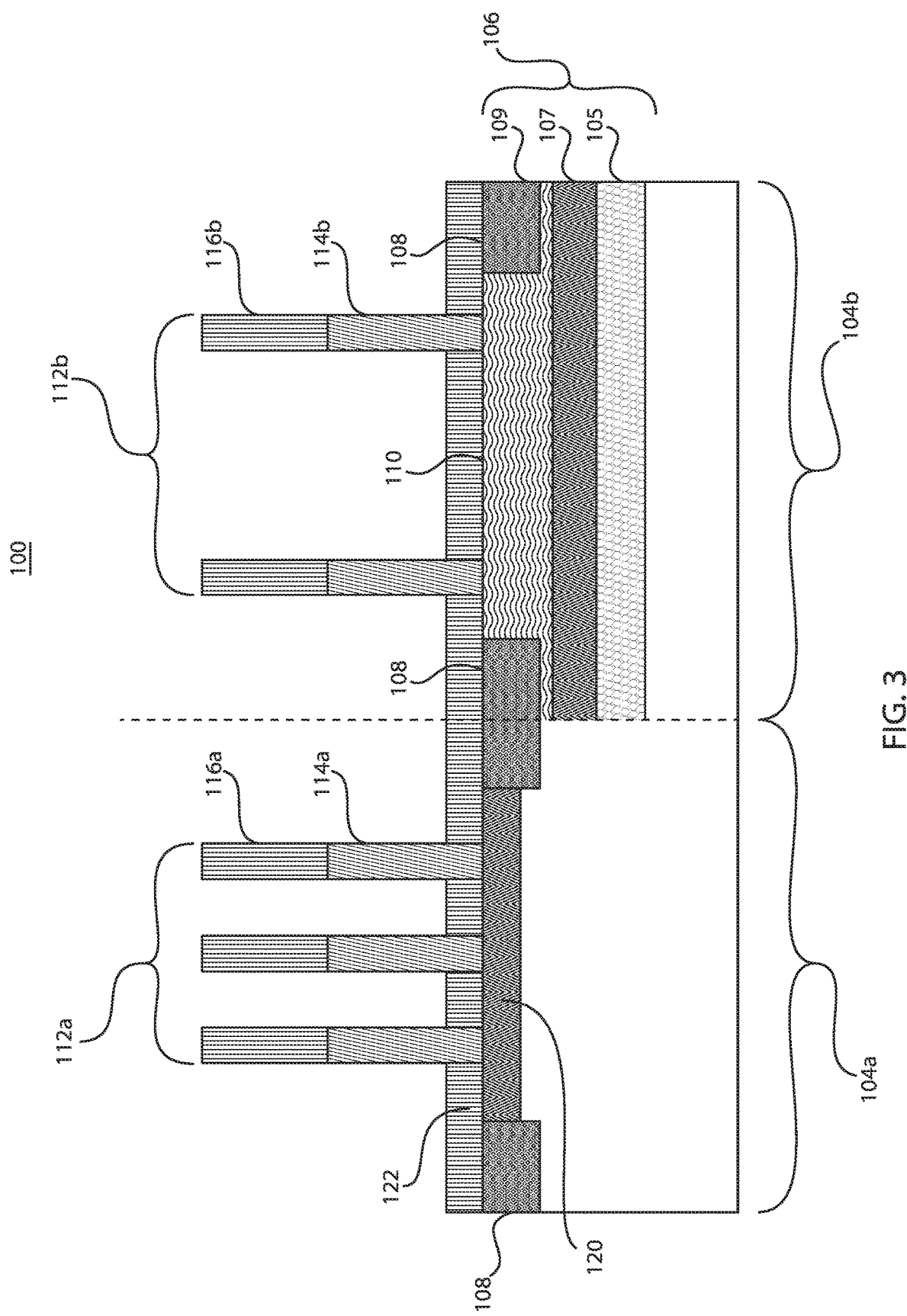
FIG. 3 is a cross-sectional view showing the formation of an epitaxial layer in the vertical FET device area and a spacer of the semiconductor device, in accordance with an embodiment of the present invention.

With reference to FIG. 3, an epitaxial layer 120 is formed. The epitaxial layer 120 can be formed via epitaxial growth and/or implantation. Epitaxial growth refers to the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial growth process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material, such as epitaxial layer 120, has substantially the same crystalline characteristics as the deposition surface on which the epitaxially grown material is formed. For example, an epitaxially grown semiconductor material deposited on a {100} orientated crystalline surface will take on a {100} orientation. The epitaxial layer 120 can be composed of a highly doped semiconductor material. In one embodiment, the epitaxial layer 120 is composed of a highly doped n-type semiconductor material, such that epitaxial layer 120 forms an n+ region.

As further shown in FIG. 3, a spacer 122 is formed. The spacer 122 can be formed by any suitable deposition process, such as CVD. The spacer 122 can be composed of a dielectric material, such as a nitride, oxide, oxynitride, or a combination thereof. In one embodiment, the spacer 122 is composed of a low-k dielectric material to reduce parasitic capacitance between gate structures to be formed later in the fabrication process. The spacer 122 can have a dielectric constant that is less than 4.0, e.g., 3.9. In one embodiment, the spacer 122 has a dielectric constant ranging from about 1.75 to about 3.5. In another embodiment, the spacer 122 has a dielectric constant ranging from about 2.0 to about 3.2. In yet an even further embodiment, the spacer 122 has a dielectric constant ranging from about 2.25 to about 3.0. An exemplary material suitable for use in forming the spacer 122 includes silicon mononitride (SiN).

Figure 4:
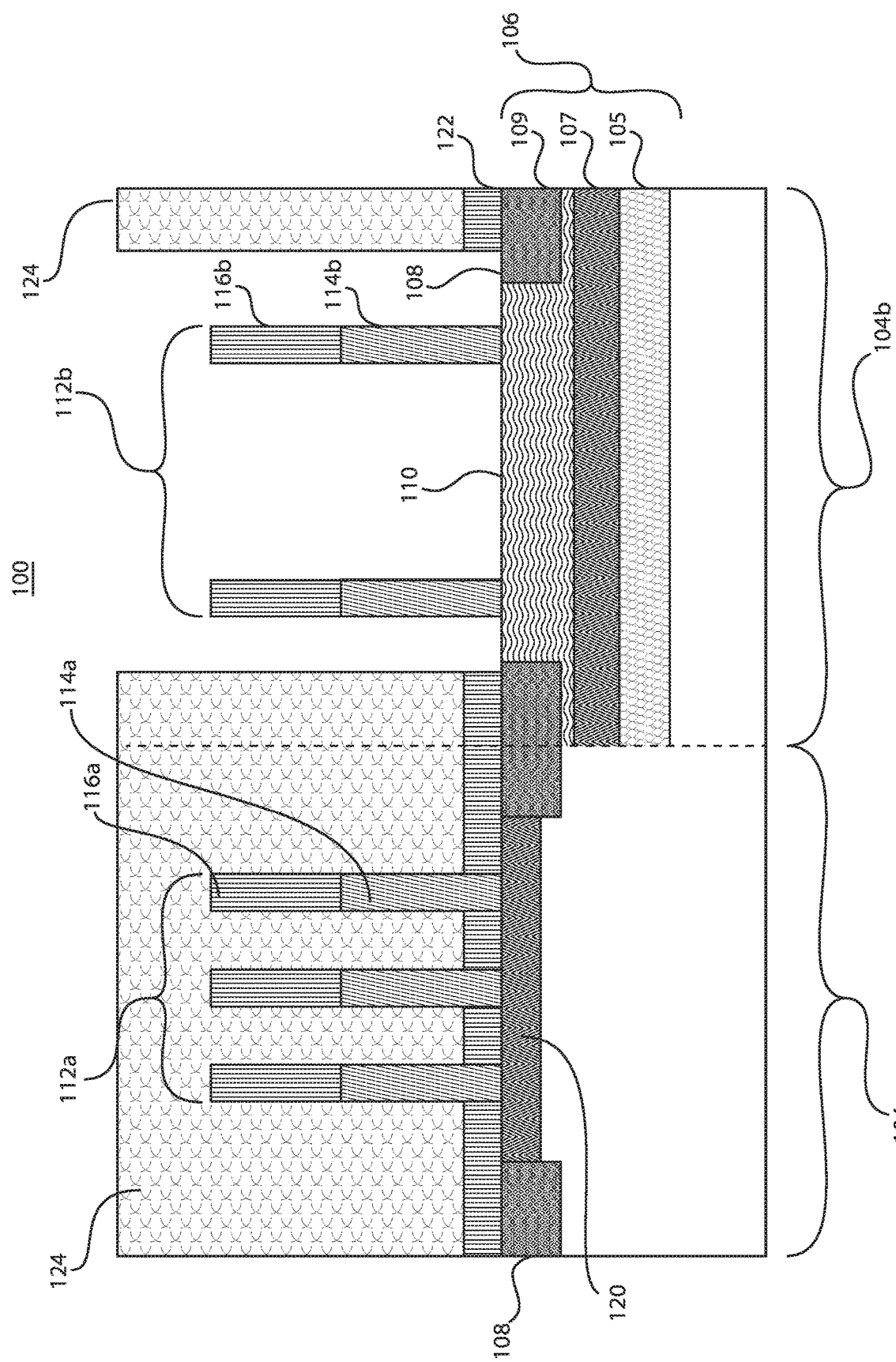
FIG. 4 is a cross-sectional view showing the etching of a spacer in the IO FET device area of the semiconductor device, in accordance with an embodiment of the present invention.

With reference to FIG. 4, a portion of the spacer 122 from the IO FET device area 104b is selectively removed. In one embodiment, and as shown, selectively removing the portion of the spacer 122 includes forming a mask 124 over the vertical FET device area 104a and over select portions of the IO FET device area 104b, and etching away the spacer 122 from the portions of the IO FET device area 104b that are not protected by the mask 124. The mask 124 can include soft and/or hard mask materials and can be formed using deposition, photolithography and etching. In one embodiment, the mask 124 comprises a photoresist. The photoresist can be produced by applying a photoresist layer, exposing the photoresist layer to a pattern of radiation, and then developing the pattern into the photoresist layer utilizing a resist developer.

Figure 5:
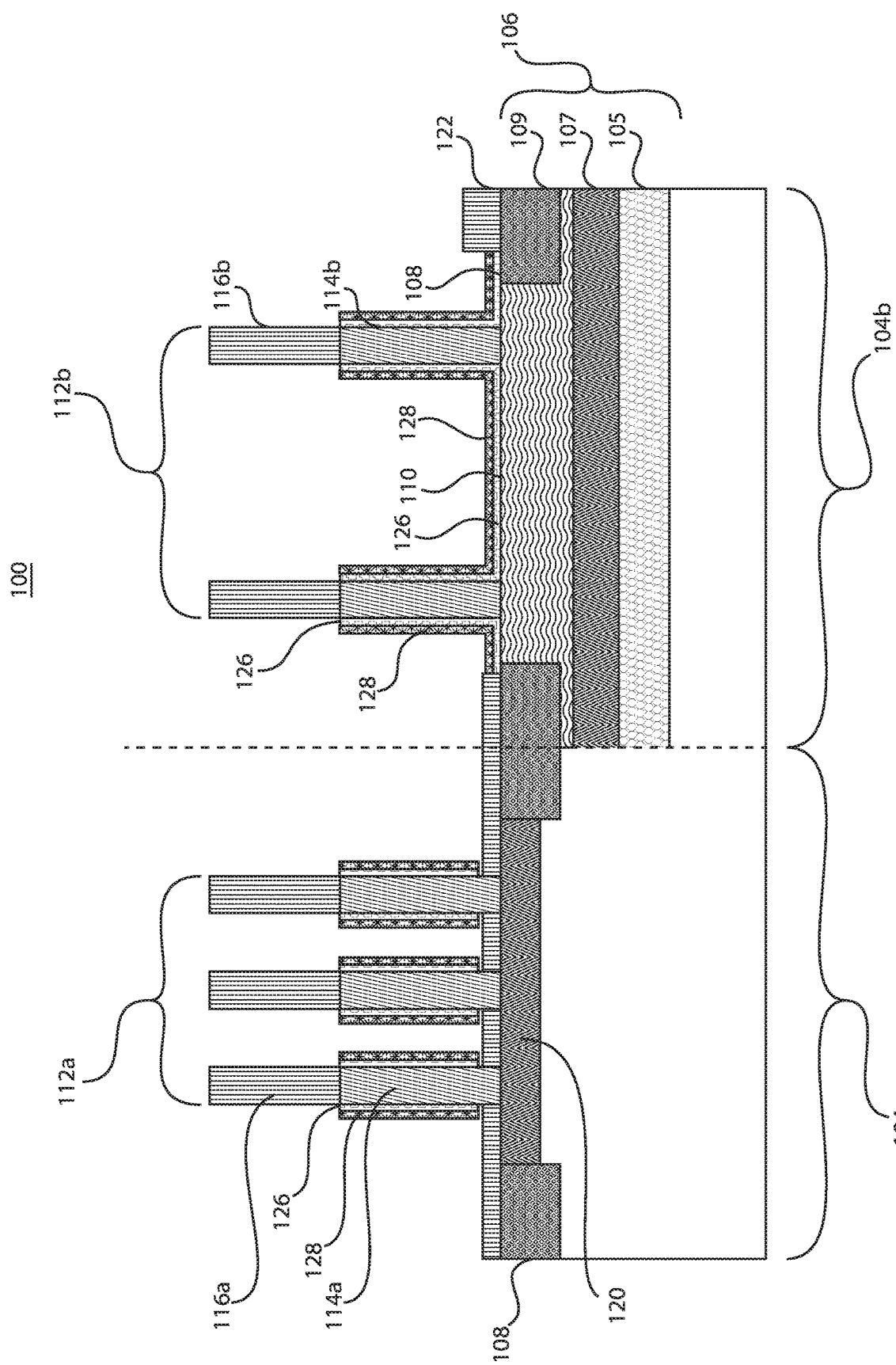
FIG. 5 is a cross-sectional view showing the formation of gate structures of the semiconductor device, in accordance with an embodiment of the present invention.

With reference to FIG. 5, mask 124 is removed, a gate dielectric layer 126 is deposited on fins 114a and 114b and the exposed portion of the IO FET device area 104b, and a work function metal layer 128 is deposited on the gate dielectric layer 126.

The gate dielectric layer 126 functions as an insulator between the substrate 102 and the work function metal layer 128. The gate dielectric layer 126 can be composed of any material suitable for use in accordance with the embodiments described herein. For example, the gate dielectric layer 126 can be composed of a high-k dielectric material. A high-k dielectric material is a dielectric material having a dielectric constant greater than silicon oxide ($SiO_2$) at room temperature (e.g., about 20° C. to about 25° C.) and standard pressure (e.g., 1 atmosphere or atm). For example, a high-k dielectric material can have a dielectric constant greater than 4.0. In another example, the high-k gate dielectric material has a dielectric constant greater than 7.0. In one embodiment, the gate dielectric layer 126 is composed of a high-k oxide, such as, for example, Hafnium Oxide ($HfO_2$). In one embodiment, the gate dielectric layer 126 can be deposited by CVD.

The work function metal layer 128 can be formed using suitable deposition techniques, such as physical vapor deposition (PVD), CVD, atomic layer deposition (ALD), sputtering and/or plating. The work function metal layer 128 can be comprised of any material suitable for use as a work function metal in accordance with the embodiments described herein. Non-limiting examples of materials that can compose the work function metal layer 128 include one or more of one or more of titanium aluminum (TiAl), titanium nitride (TiN), tantalum nitride (TaN), hafnium nitride (HfN) and hafnium silicide (HfSi). Thus, the IO FET device being formed in IO FET device area 104b can have a gate structure that includes a gate dielectric 126 that includes a high-k dielectric and a work function metal 128.

The gate dielectric layer 126 and the work function metal layer 128 collective form gate structures. The gate structures in the IO FET device area 104b land on the STI regions 110 to avoid punch-through to the substrate 102.

Figure 6:
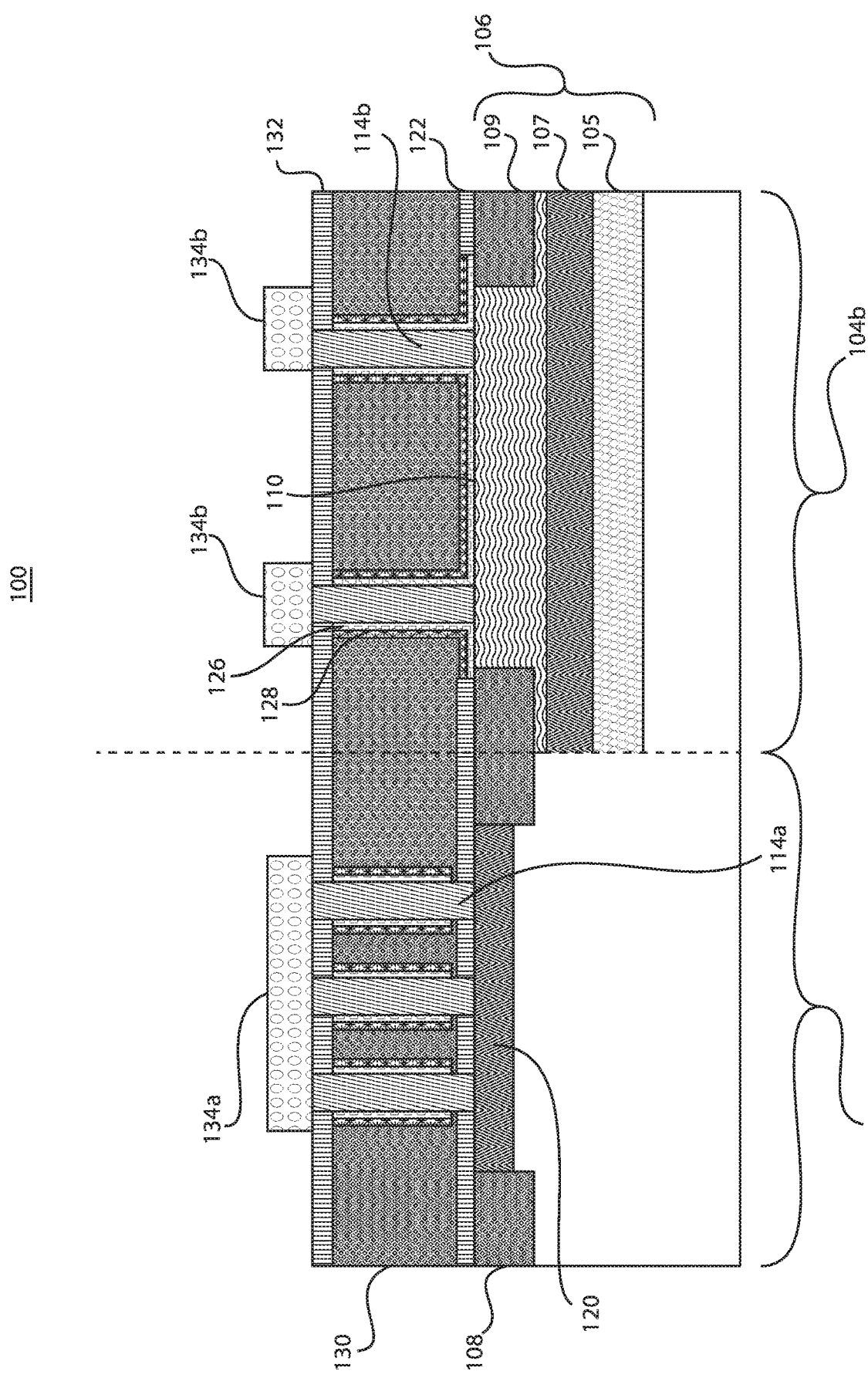
FIG. 6 is a cross-sectional view showing the formation of a spacer and respective epitaxial layers of the semiconductor device, in accordance with an embodiment of the present invention.

With reference to FIG. 6, an interlayer dielectric (ILD) 130 is formed to a given height below the fins, including fins 114a and 114b. In one embodiment, forming the ILD 130 comprises depositing dielectric material on the substrate, planarizing down to the exposed surfaces of the caps 116a and 116b, performing an etch process to remove a portion of the dielectric material, and removing the caps 116a and 116b. In one embodiment, the etch process includes a RIE process. The dielectric material can be composed of any material suitable for use as ILD material in accordance with the embodiments described herein, such as, for example, $SiO_2$. In one embodiment, a conformal layer that includes a material such as SiN, SiBCN, SiOC, etc. can be deposited prior to deposition of $SiO_2$.

As further shown, a spacer 132 is formed on the ILD 130 up to a height of the fins in the vertical FET device area 104a and the IO FET device area 104b, including fins 114a and 114b. The spacer 132 can be comprised of any material suitable for use as spacer material in accordance with the embodiments described herein, such as, for example, SiN, SiBCN, SiOC, etc.

It should be noted that the spacer 132 can have different thickness than the spacer 122. Also, the spacer 132 can have different thickness for IO device and logic devices. This could be done by any masked trimming process (e.g., by protecting the IO device with a lithography mask, and trimming the logic device area to make the top spacer thinner than the top spacer in the IO device area).

As further shown, epitaxial layer 134a is formed on the fins in the vertical FET device area 104a, including fin 114a, and epitaxial layer 134b is formed on the fins in the IO FET device area 104b, including fin 114b.

Figure 7:
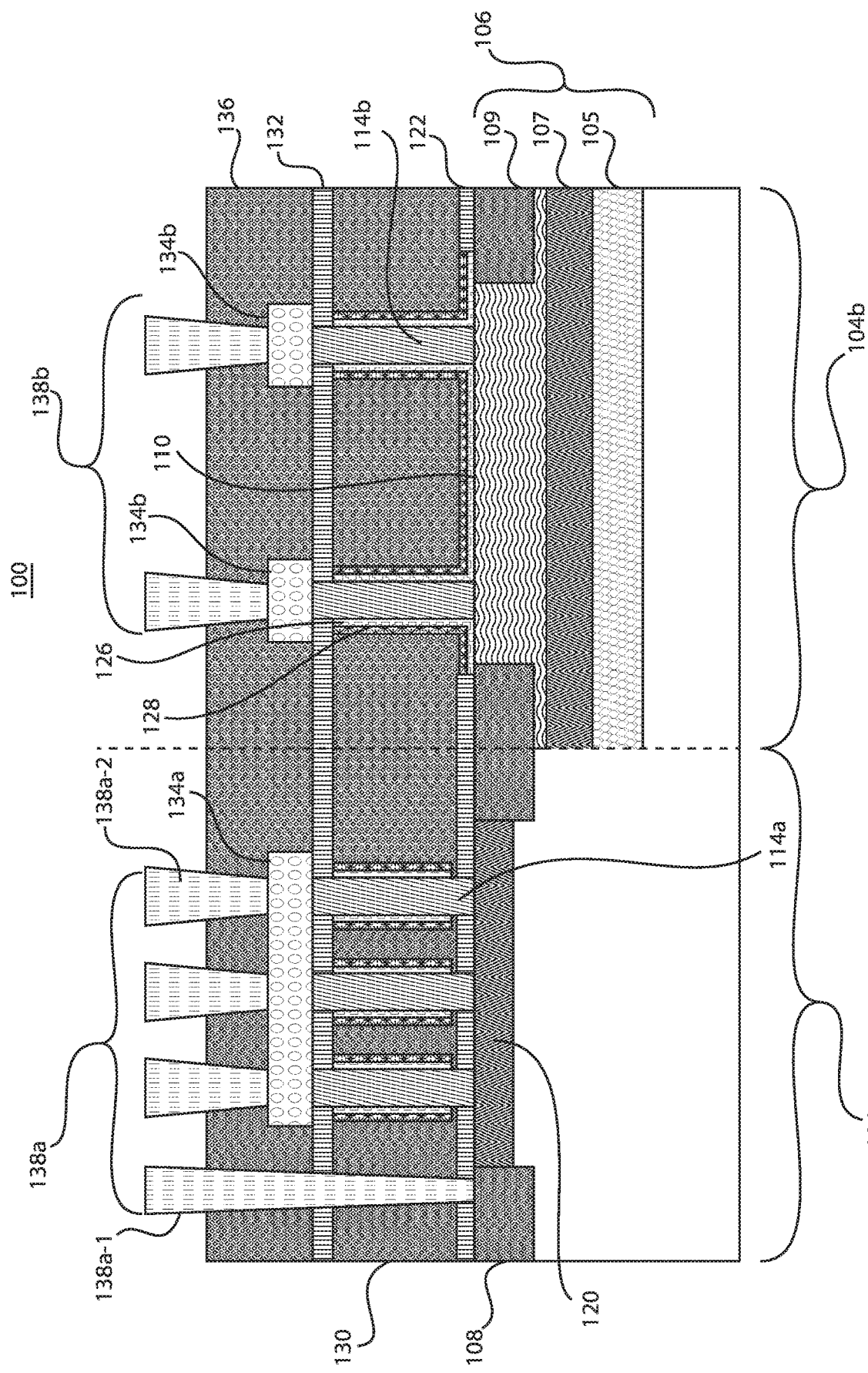
FIG. 7 is a cross-sectional view showing the formation of contacts of the semiconductor device, in accordance with an embodiment of the present invention.

With reference to FIG. 7, an ILD cap layer 136 is formed. The ILD cap layer 136 can be composed of any material suitable for use as dielectric material in accordance with the embodiments described herein. For example, the ILD cap layer 136 can be composed of $SiO_2$. As further shown, source/drain contacts 138a are formed in the vertical FET device area 104a and source/drain contacts 138b are formed in the IO FET device area 104b. Source/drain contacts 138a include a trench silicide ("TS") contact 138a-1 and "CA" contacts, including CA contact 138a-2. The source/drain contacts 138a and 138b can be composed any of material suitable for use as source/drain contacts in accordance with the embodiments described herein.

Although not depicted in FIG. 7, a gate contact is formed in each of the vertical FET device area 104a and the IO FET device area 104b. A further description of the gate contacts will be provided below with reference to FIG. 8.

Accordingly, the substrate 100 has a vertical FET device 140a formed in the vertical FET device area 104a, and integrates an IO FET device formed in the IO FET device area 104b.

Figure 8:
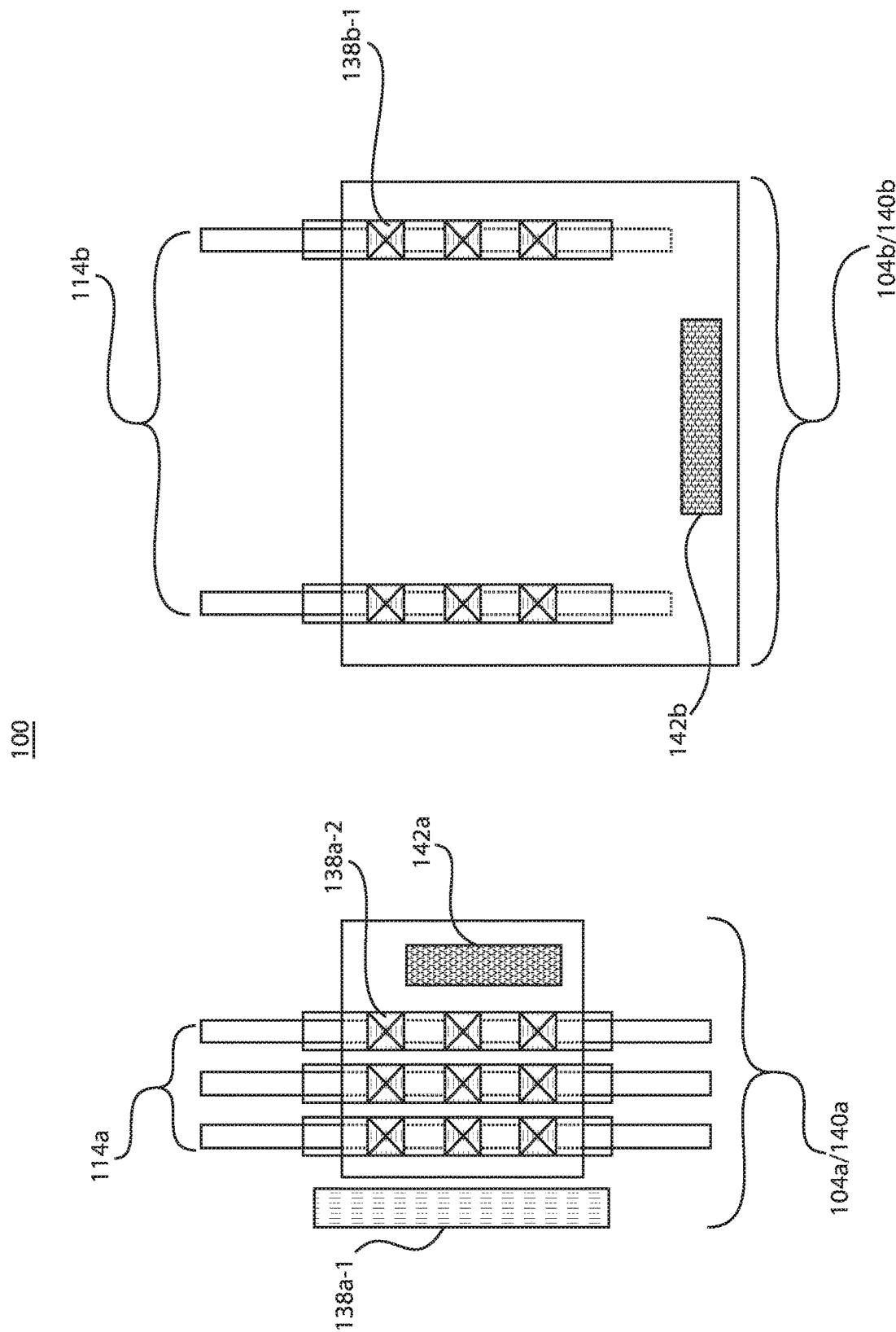
FIG. 8 is a top-down view showing the semiconductor device, in accordance with an embodiment of the present invention.

FIG. 8 illustrates a top-down view of a vertical FET device 140a formed in the vertical FET device area 104a of the device 100 and an IO FET device 140b formed in the IO FET device area 104b of the device 100.

The vertical FET device 140a includes fins 114a and contacts. As shown, the contacts include source/drain contacts 138a that include TS contact 138a-1 and CA contacts, including CA contact 138a-2. The contacts of the vertical FET device 140a further include a gate contact ("CB contact") 142a.

The IO FET device 140b includes fins 114b and contacts. As shown, the contacts include source/drain contacts that include CA contact 138b. The contacts of the IO FET device 140a further include a gate contact ("CB contact") 142b.

Figure 9:
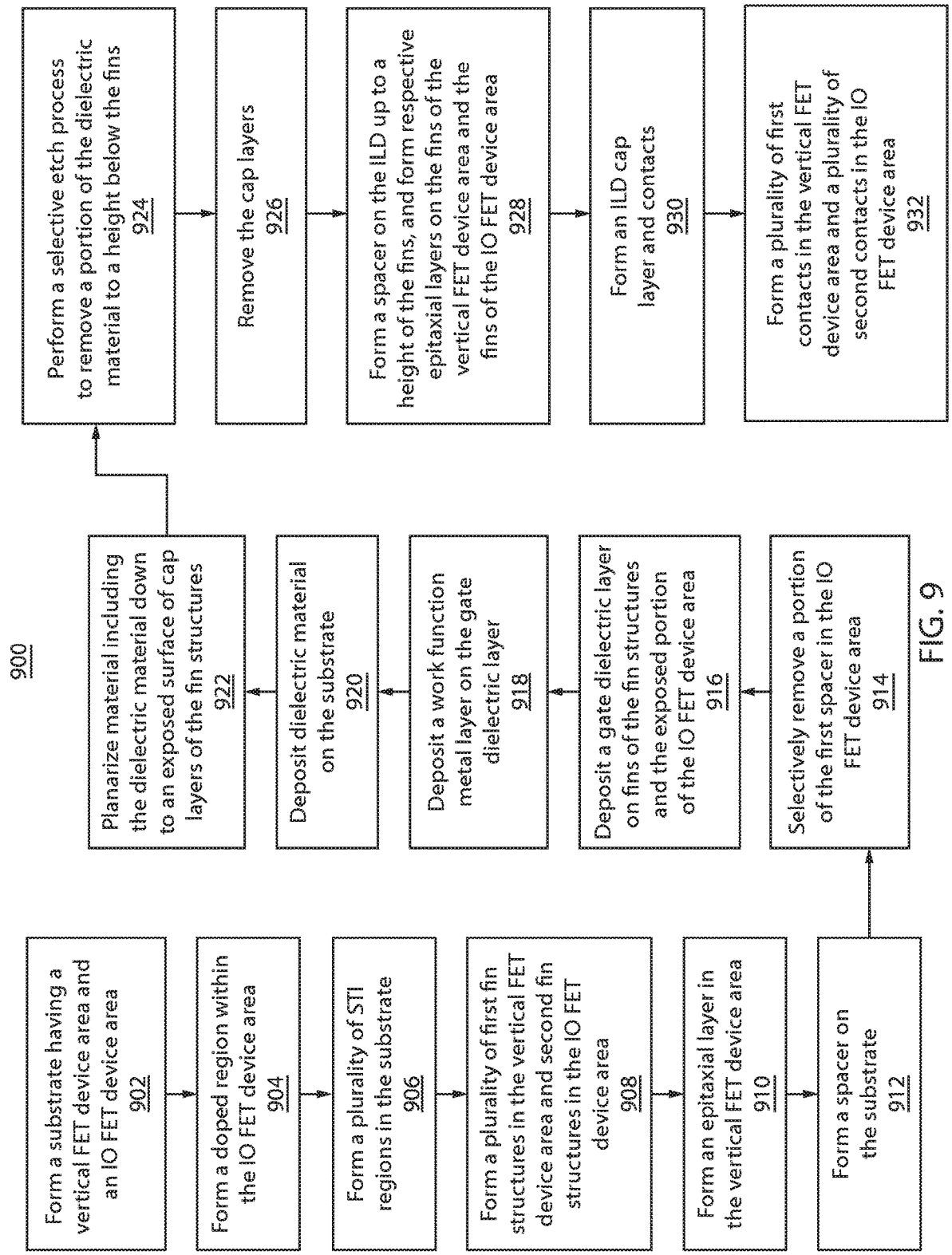
FIG. 9 is a block/flow diagram showing a system/method for fabricating a semiconductor device that integrates an I/O device in vertical FET technology, in accordance with an embodiment of the present invention.

With reference to FIG. 9, a block/flow diagram 900 is provided illustrating a process for fabricating a semiconductor device.

At block 902, a substrate is formed having a vertical FET device area and an IO FET device area. The substrate 102 can include any suitable substrate structure, e.g., a bulk semiconductor, a semiconductor-on-insulator (SOI) substrate, etc. The substrate 102 can be composed of any material suitable for use in accordance with the embodiments described herein.

At block 904, a doped region is formed within the IO FET device area by employing a channel doping process within the IO FET device area. The doped region includes one or more layers. For example, the doped region can include three layers having respective conductivity types and respective amounts of doping.

At block 906, a plurality of STI regions are formed in the substrate. For example, the STI regions may be formed by etching trenches in the substrate, and filling the trenches with a dielectric material, such as silicon dioxide ($SiO_2$). After the etching, the trenches can then be optionally lined with a liner material, e.g., an oxide, prior to filling the trenches with the STI material using a suitable deposition process (e.g., CVD). A planarization process such as chemical-mechanical polishing (CMP) can optionally be employed after the filling to provide a planar structure.

At block 908, a plurality of fin structures is formed in the VFET device area and the IO FET device area. Each fin structure can include a fin and a cap formed on the fin. In one embodiment, the IO FET device area includes at least two fins, with one fin representing a source region and another fin representing a drain region. The caps can be composed of soft and/or hard mask materials suitable for use in accordance with the embodiments described herein, and can be formed using one or more processes, such as deposition, photolithography and/or etching. In one embodiment, one or more of the caps are composed of a nitride-containing material, such as silicon nitride. It is noted that it is not intended that the cap material be limited to only silicon nitride, as the composition of the caps can include any dielectric material that can be deposited by chemical vapor deposition (CVD) and/or related methods.

At block 910, an epitaxial layer is formed in the vertical FET device area. The epitaxial layer can be formed via epitaxial growth and/or implantation. The epitaxial layer can be composed of a highly doped semiconductor material. In one embodiment, the epitaxial layer 120 is composed of a highly doped n-type semiconductor material, such that epitaxial layer 120 forms an n+ region.

At block 912, a spacer is formed on the substrate. The spacer can be formed by any suitable deposition process, such as CVD. The spacer can be composed of a dielectric material, such as a nitride, oxide, oxynitride, or a combination thereof. In one embodiment, the spacer is composed of a low-k dielectric material to reduce parasitic capacitance between gate structures to be formed later in the fabrication process. An exemplary material suitable for use in forming the spacer includes silicon mononitride (SiN).

At block 914, a portion of the spacer in the IO FET device region is selectively removed. In one embodiment, and as discussed above, selectively removing the portion of the spacer includes forming a mask over the vertical FET device area and over select portions of the IO FET device area, and etching away the spacer from the portions of the IO FET device area that are not protected by the mask. The mask can include soft and/or hard mask materials and can be formed using deposition, photolithography and etching.

At block 916, a gate dielectric layer is deposited on the fins and the exposed portion of the IO FET device area (i.e., the portion of the IO FET device area left exposed by the selective removal of the portion of the first spacer). The gate dielectric layer 126 can be composed of any material suitable for use in accordance with the embodiments described herein. For example, the gate dielectric layer 126 can be composed of a high-k dielectric material.

At block 918, a work function metal layer is deposited on the gate dielectric layer. The work function metal layer can be deposited using suitable deposition techniques, such as physical vapor deposition (PVD), CVD, atomic layer deposition (ALD), sputtering and/or plating.

Blocks 916 and 918 collectively form gate structures on respective fins.

At block 920, dielectric material is deposited on the substrate. The dielectric material can be composed of any material suitable for use as ILD material in accordance with the embodiments described herein (e.g., $SiO_2$). In one embodiment, a conformal layer that includes a material such as SiN, SiBCN, SiOC, etc. can be deposited prior to deposition of $SiO_2$.

At block 922, material including the dielectric material is planarized down to the exposed surfaces of the caps of the fin structures.

At block 924, a selective etch process is performed to remove a portion of the dielectric material to a height below the fins, such as RIE.

Blocks 920-924 collectively form an ILD.

At block 926, the caps are removed. Any process may be used to remove the cap material, in accordance with the embodiments described herein.

At block 928, a spacer is formed on the ILD up to a height of the fins, and respective epitaxial layers are formed on the fins of the VFET device area and the fins of the IO FET device area.

At block 930, an ILD cap layer is formed.

At block 932, a plurality of contacts is formed in the vertical FET device area and a plurality of contacts are formed in the IO FET device area. Accordingly, a vertical FET device is formed in the vertical FET device area and an IO FET device is formed in the IO FET device area.

Further details regarding blocks 902-932 are discussed herein above with reference to FIGS. 1-8. Accordingly, an IO FET integration scheme compatible to vertical FET technology for future circuit design IO application has been illustrated.

As previously mentioned, the embodiments described herein provide an IO device integration scheme compatible to vertical FET technology. For example, embodiments of the present invention provide for the formation of an IO device on the same substrate as a vertical FET device in a way that allows for the breakdown voltage and drive current needs of the IO device for an application to be met.

Voltage level shifting can be achieved by choosing different breakdown voltages and circuit configurations. The IO device threshold voltage can be controlled by the turn-on of the fin section, and is similar to the vertical FET device threshold voltage (around 0.3V). There is no halo implant such that the IO device drive current can be high, and there is a low delay in switching.

Having described preferred embodiments of the integration of an input/output device in vertical field-effect transistor technology (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device, comprising:
   forming a vertical field-effect transistor (FET) device and an input/output (IO) FET device, wherein the vertical FET device is formed in a vertical FET device area of a substrate and the IO FET device is formed in an IO FET device area of the substrate, and wherein forming the vertical FET device and the IO FET device further comprises:
      forming a plurality of first fin structures in the vertical FET device area;
      forming at least two second fin structures in the IO FET device area, wherein the at least two second fin structures are separated by a distance associated with a length of a channel connecting the at least two second fin structures, and wherein the length of the channel is determined based on at least one voltage for implementing the IO FET device; and
      selectively exposing a portion of the IO FET device area for further processing of the vertical FET and IO FET devices, including selectively removing a portion of a first spacer formed on the substrate in the IO FET device area.

2. The method of claim 1, further comprising forming a doped region within the IO FET device area prior to forming the plurality of first and second fin structures.

3. The method of claim 1, wherein forming the vertical FET device and the IO FET device further comprises forming a plurality of shallow trench isolation regions in the substrate prior to forming the first and second fin structures.

4. The method of claim 1, wherein forming the vertical FET device and the IO FET device further comprises forming the first spacer on the substrate and a first epitaxial layer in the vertical FET device area.

5. The method of claim 1, wherein selectively removing the portion of the first spacer includes forming a mask over the vertical FET device area and select portions of the IO FET device area, and etching away the spacer from portions of the IO FET device area that are not protected by the mask.

6. The method of claim 1, wherein forming the vertical FET device and the IO FET device further comprises depositing gate material on the fin structures and the exposed portion of the IO FET device area.

7. The method of claim 1, wherein each of the first and second fin structures comprises a fin, and wherein the gate material is deposited on the fins.

8. The method of claim 1, wherein forming the vertical FET device and the IO FET device further comprises forming an interlayer dielectric (ILD) after depositing the gate material.

9. The method of claim 8, wherein each of the first and second fin structures comprises a cap formed on a fin, and wherein forming the ILD comprises depositing dielectric material on the substrate, planarizing material including the dielectric material down to exposed surfaces of the caps, and performing a selective etch process to remove a portion of the dielectric material to a height below the fins.

10. The method of claim 8, wherein forming the vertical FET device and the IO FET device further comprises forming a second spacer on the ILD, and forming respective epitaxial layers above the first and second fin structures.

11. The method of claim 10, wherein forming the vertical FET device and the IO FET device further comprises forming an ILD cap layer, and forming a plurality of first contacts in the vertical FET device area and a plurality of second contacts in the IO FET device area.

12. A method for fabricating a semiconductor device, comprising:
   forming a vertical field-effect transistor (FET) device and an input/output (IO) FET device, wherein the vertical FET device is formed in a vertical FET device area of a substrate and the IO FET device is formed in an IO FET device area of the substrate, and wherein forming the vertical FET device and the IO FET device further comprises:
      forming a plurality of first fin structures in the vertical FET device area, and at least two second fin structures in the IO FET device area, the at least two second fin structures being separated by a distance associated with a length of a channel connecting the at least two second fin structures, wherein the length of the channel is determined based on at least one voltage for implementing the IO FET device;
      forming a first spacer on the substrate;

selectively removing a portion of the first spacer in the IO FET device area to create an exposed portion of the IO FET device area;

depositing gate material on the fin structures and the exposed portion of the IO FET device area;

forming an interlayer dielectric (ILD);

forming a second spacer on the ILD;

forming respective epitaxial layers above the first and second fin structures;

forming an ILD cap layer; and forming a plurality of first contacts in the vertical FET device area and a plurality of second contacts in the IO FET device area.

13. The method of claim 12, further comprising:

forming a doped region within the IO FET device area prior to forming the plurality of first and second fin structures;

forming a plurality of shallow trench isolation regions in the substrate; and forming a first epitaxial layer in the vertical FET device area after forming the first and second fin structures.

14. The method of claim 12, wherein each of the first and second fin structures comprises a fin, and wherein depositing the gate material on the fin structures comprises depositing the gate material on the fins.

15. The method of claim 12, wherein each of the first and second fin structures comprises a fin and a cap formed on the fin, wherein the ILD is formed to a height below the fins, and wherein forming the ILD comprises depositing dielectric material on the substrate, planarizing material including the dielectric material down to exposed surfaces of the caps, and performing a selective etch process to remove a portion of the dielectric material to the height below the fins.

* * * * *